United States Patent
Zhang et al.

(10) Patent No.: US 7,973,562 B1
(45) Date of Patent: Jul. 5, 2011

(54) UNIVERSAL SINK/SOURCE I/O MODULE FOR INDUSTRIAL CONTROLLER

(75) Inventors: Yanbin Zhang, Shanghai (CN); Look Thong Wong, Singapore (SG); Swee Meng Seow, Singapore (SG); Eng Tiong Soh, Singapore (SG)

(73) Assignees: Rockwell Automation Technologies, Inc., Mayfield Heights, OH (US); Rockwell Automation Asia Pacific Business Ctr. Pte., Singapore (SG)

( * ) Notice: Subject to any disclaimer, the term of this patent is extended or adjusted under 35 U.S.C. 154(b) by 0 days.

(21) Appl. No.: 12/728,777

(22) Filed: Mar. 22, 2010

(51) Int. Cl.
*H03K 19/094* (2006.01)
(52) U.S. Cl. .......... 326/83; 307/115; 307/143; 700/275; 710/36
(58) Field of Classification Search .............. 326/82–83; 307/115, 139, 143; 700/275, 286, 295, 297; 710/36, 38
See application file for complete search history.

(56) References Cited

U.S. PATENT DOCUMENTS

| | | | |
|---|---|---|---|
| 6,549,034 B1 * | 4/2003 | Pietrzyk et al. | 326/38 |
| 6,904,471 B2 * | 6/2005 | Boggs et al. | 710/8 |
| 7,672,738 B2 * | 3/2010 | Ward | 700/11 |
| 2003/0151312 A1 * | 8/2003 | Maskovyak et al. | 307/117 |
| 2009/0182458 A1 * | 7/2009 | Heinemann et al. | 700/295 |

OTHER PUBLICATIONS www.automationdirect.com/fieldIO, Universal Field I/O, pp. 7012-7-16 and 7-25-7-32, 7-36-7-41 (admitted prior art).
Chapter 7 Digital Output (DO) Circuit, FATER Automation Corporation, pp. H7-1-H7-8 )admitted prior art).
Chapter 2: Installation and Field Wiring, Counter I/O User Manual (admitted prior art).
Product Spec, PICO-DIO16R08, Access I/O Products, Inc., http://acessio.com/go.cgi pp. 1-4, (admitted prior art).

* cited by examiner

*Primary Examiner* — Jason M Crawford
(74) *Attorney, Agent, or Firm* — Boyle Fredrickson LLP; R. Scott Speroff; John M. Miller

(57) ABSTRACT

An I/O module for an industrial controller provides single terminal outputs that may either sink or source current. This capability is provided through the use of dedicated sourcing and sinking transistors connected to the terminal and controlled by lockout logic ensuring activation of only the appropriate transistor in the correct phasing for sinking or sourcing operation modes.

19 Claims, 3 Drawing Sheets

UNIVERSAL SINK/SOURCE I/O MODULE FOR INDUSTRIAL CONTROLLER

BACKGROUND OF THE INVENTION

The present invention relates to industrial controllers used in controlling industrial machines and processes and, more particularly, to I/O modules being part of the industrial controller and providing an electrical interface between the industrial controller and the machine or process.

Industrial controllers are employed in industrial and commercial applications to control the operation of machines and processes. Generally the industrial controller executes a stored control program to control outputs to actuators on the machine or process according to inputs received from sensors on the machine or process.

Industrial controllers differ from conventional computers in providing real-time control subject to predetermined maximum delays. In addition, industrial controllers are normally constructed in a highly modular fashion to permit their hardware to be customized according to different control applications. In this latter regard, inputs and outputs to or from the industrial controller are normally handled by input/output (I/O) modules that may be attached to the industrial controller in different combinations to provide for the necessary electrical interface to the controlled machinery.

Different types of I/O modules may be used for different control applications. Input I/O modules provide specialized input circuits to receive signals from sensors and the like, and output I/O modules provide specialized output circuits to provide signals to actuators or the like. Two common output circuits are alternating current (AC) output circuits, typically employing an SCR or thyristor to switch an AC signal, and direct current (DC) output circuits typically employing a transistor to switch a DC signal. DC output circuits are often distinguished according to whether they provide "sinking outputs" that is, a switchable connection to ground that may receive current or "sourcing outputs" that provide a switchable connection to a power source that may output current.

In certain control applications, it may be desirable to provide both sinking and sourcing DC output circuits in a single I/O module. One method of accomplishing this, to be discussed further below, provides a single "floating" transistor that may be alternately connected to a load (e.g. an actuator) to provide a source of current or with a different connection, a sink of current.

Referring now to FIG. 1, a prior art universal output circuit 10 provides a first terminal 12 and a second terminal 14 connected across a drain and source terminal (respectively) of a field effect transistor (FET) 18.

The gate of the FET 18 is connected to a floating gate drive circuit providing a constant voltage 20 with respect to an isolated system ground 27 as received from a power supply 22. The output of the power supply 22 is floating with respect to an input system power source 24 and a system ground 25.

When the prior art universal output circuit 10 is operating in a sinking mode, an actuator 26 will have one terminal connected to terminal 12 and the other terminal connected to a positive terminal of an externally provided DC power source 28. The negative terminal of the externally provided DC power source 28 is connected to terminal 14. Activation of an optical isolator 30 by digital control signal 32 causes conduction of transistor 34 of the optical isolator 30 pulling down the source terminal of the FET 18 with respect to the gate terminal at voltage 20 to bias the FET 18 into conduction drawing current into terminal 12.

Referring now to FIG. 2, when the prior art universal output circuit 10 is operating in a sourcing mode, the actuator 26 must be disconnected from terminal 12 and connected to terminal 14. The remaining terminal of the actuator 26 is then reconnected to the negative power supply terminal of power source 28 while the positive power supply terminal of power source 28 is connected to terminal 12.

In this mode, activation of the optical isolator 30 by digital control signal 32 again pulls down the source terminal of the FET 18 with respect to the gate terminal, but this time to cause a sourcing of current through terminal 14. This dual mode of operation requires power supply 20 to be floating with respect to the power source 28. In addition, changing the mode of operation requires a rewiring of the actuator 26 with respect to the terminals 12 and 14 and the power source 28. This latter reconnection of terminals either requires changing the connections to the terminals of the I/O module or the use of an internal, high current capacity, multi-pole switch connected between the FET 18 and the terminals 12 and 14.

While this approach provides great flexibility in using outputs of the I/O module, the need to change connections to the single transistor requires undesirable switching circuitry or confusing change in external wiring procedures of actuators to the I/O module terminals. The control of a floating transistor requires a floating power supply that may be susceptible to damage.

SUMMARY OF THE INVENTION

The present invention provides an I/O module DC output circuit that may either sink or source current through a given single terminal of the I/O module as determined by a single low current direction signal. This former feature simplifies wiring actuators to the I/O module and the latter feature eliminates the need for rerouting of high current signals through a switch mechanism. The complexity of creating a drive signal for a floating transistor using a floating power supply is also eliminated.

These features are provided by using a dedicated sinking and sourcing transistor permanently connected to a single output terminal but driven by lockout circuitry allowing only one transistor to operate at a time.

Specifically, the present invention provides an I/O module for an industrial controller, the I/O module providing digital control signals for controlling application of electrical power to actuators on a controlled machine during a true state of the digital control signals. The I/O module includes an electrical connector for releasably attaching the I/O module to the industrial controller for communication of the digital control signals therebetween. For a given digital control signal, the I/O module provides:

(1) a releasable terminal providing a connection to the actuator for the provision of electrical power to the actuator in accordance with the state of the given digital control signal;

(2) a first transistor device connected between the releasable terminal and a terminal receiving a first DC voltage to provide a current flow from the first DC voltage to the releasable terminal when the first transistor device is turned on;

(3) a second transistor device connected between the releasable terminal and a terminal receiving a second DC voltage to provide a current flow from the releasable terminal to the second DC voltage source when the second transistor is turned on; and (4) a logic circuit providing transistor control signals to the first and second transistor and receiving the given digital control signal and a direction signal indicating whether the releasable terminal should operate as a sourcing DC output or a sinking DC input.

The logic circuit operates so that when the direction signal indicates that the releasable terminal should operate as a sourcing DC output:

(i) a transistor control signal is provided to the first transistor turning the first transistor on only when the given digital control signal is true and otherwise turning the first transistor off, and (ii) a transistor control signal is provided to the second transistor turning the second transistor off both when the given digital control signal is true and otherwise.

On the other hand, the logic circuit operates so that when the direction signal indicates that the releasable terminal should operate as a sinking DC output:

(i) a transistor control signal is provided to the second transistor turning the second transistor on only when the given digital control signal is true and otherwise turning the second transistor off, and (ii) a transistor control signal is provided to the first transistor turning the first transistor off both when the given digital control signal is true and otherwise.

It is thus a feature of at least one embodiment of the invention to provide a universal DC output circuit that may either sink or source current depending on a simple setting received by a logic circuit.

The first and second transistors are both n-channel MOSFET transistors.

It is thus a feature of a least one embodiment of the invention to eliminate the need for p-channel MOSFETs that in the absence of drive signals will conduct possibly creating an undesirable control state.

The I/O module may further include an electrical switch manually operable to provide the direction signal.

It is thus a feature of at least one embodiment of the invention to provide a simple signal to control the mode of operation of the output signal eliminating the need to switch high current output signals.

The I/O module may include a housing fitting within a chassis. When the I/O module is in the chassis mating electrical connectors engage between the chassis and I/O module communicating the digital control signals to the I/O module. An exposed face of the housing holds the releasable terminals and the electrical switch is positioned to be covered by the chassis when the housing is fit within the chassis.

It is thus a feature of a least one embodiment of the invention to provide a user controllable mode of operation for the I/O output circuits that is resistant to inadvertent alteration after wiring is complete.

The electrical switch may provide a switchable connection to a first electrical voltage and a resistive connection to a second electrical voltage so that when the switchable connection is open the direction signal indicates that the releasable terminal should operate as a sinking DC output.

It is thus a feature of a least one embodiment of the invention to provide a switch that fails in the sinking mode reducing the possibility of an undesired control state.

The I/O module may further include a releasable terminal receiving the first DC voltage.

It is thus a feature of a least one embodiment of the invention to permit the use of user supplied voltage sources for driving actuators.

The I/O module may further include a first and second optical isolator receiving at an isolated input the transistor control signals for the first and second transistors and receiving at an isolated output the first DC voltage for generation of the isolated transistor control signals.

It is thus a feature of a least one embodiment of the invention to provide electrical isolation between the actuator signals and the signals of the industrial controller.

The I/O module may include a third releasable terminal receiving the second DC voltage.

It is thus a feature of a least one embodiment of the invention to permit a ground terminal that does not change depending on the operation of the device as sinking or sourcing.

The I/O module may include an illuminated indicator associated with the releasable terminal illuminating when the digital control signal is logically true to provide a visual indication of when the digital control signal is logically true.

It is thus a feature of a least one embodiment of the invention to provide a consistent and familiar visual indication of the logical state of the output signal regardless of whether it is sinking or sourcing.

The I/O module may further include a serial communication circuit exchanging serial data with the industrial controller to provide the digital control signals.

It is thus a feature of a least one embodiment of the invention to provide a circuit suitable for use with modern industrial controllers using serial communication data.

These particular features and advantages may apply to only some embodiments falling within the claims and thus do not define the scope of the invention.

DETAILED DESCRIPTION OF THE PREFERRED EMBODIMENT

Figure 1:
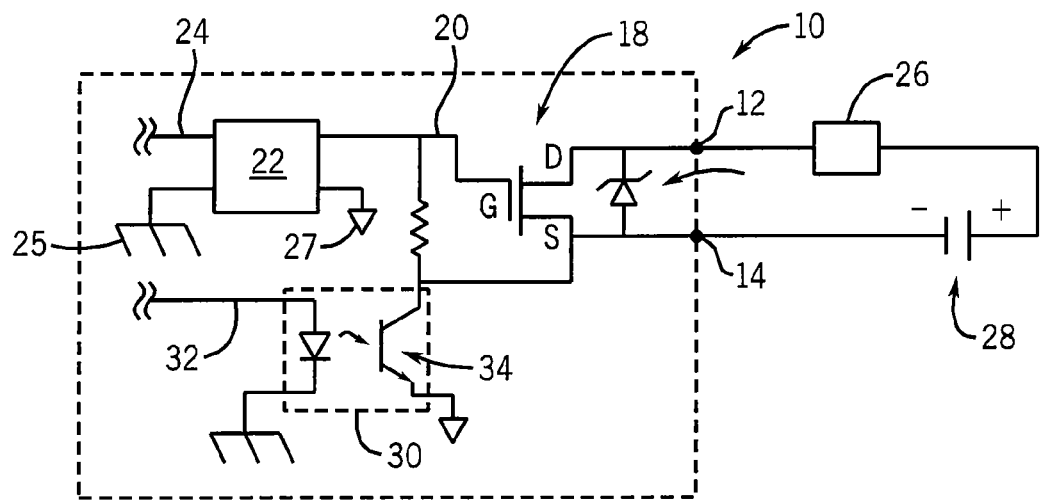
FIG. 1 is a prior art I/O circuit for providing both sinking and sourcing using a floating transistor and floating drive with the prior art circuit configured in a sinking mode with a first connection between the load and the floating transistor.
Figure 2:
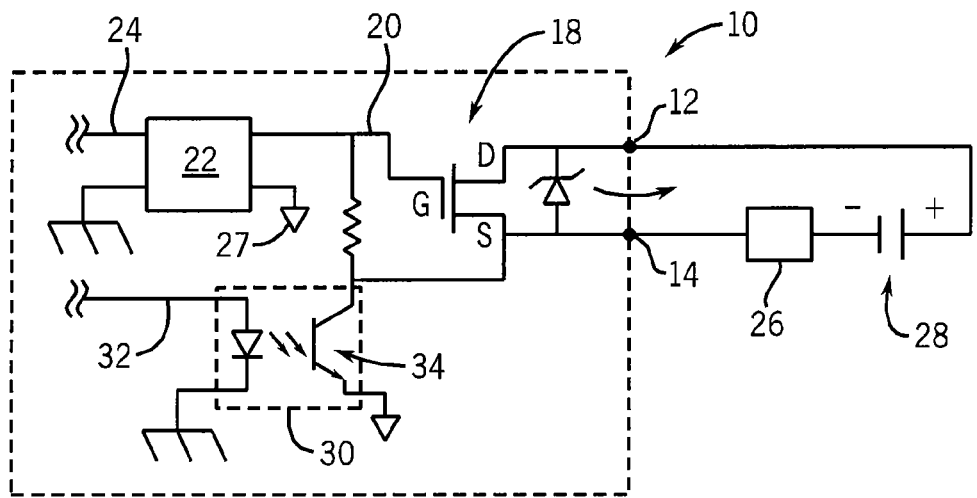
FIG. 2 is a figure similar to that of FIG. 1 with the I/O circuit configured in sourcing mode with a second connection between the load and the floating transistor.
Figure 3:
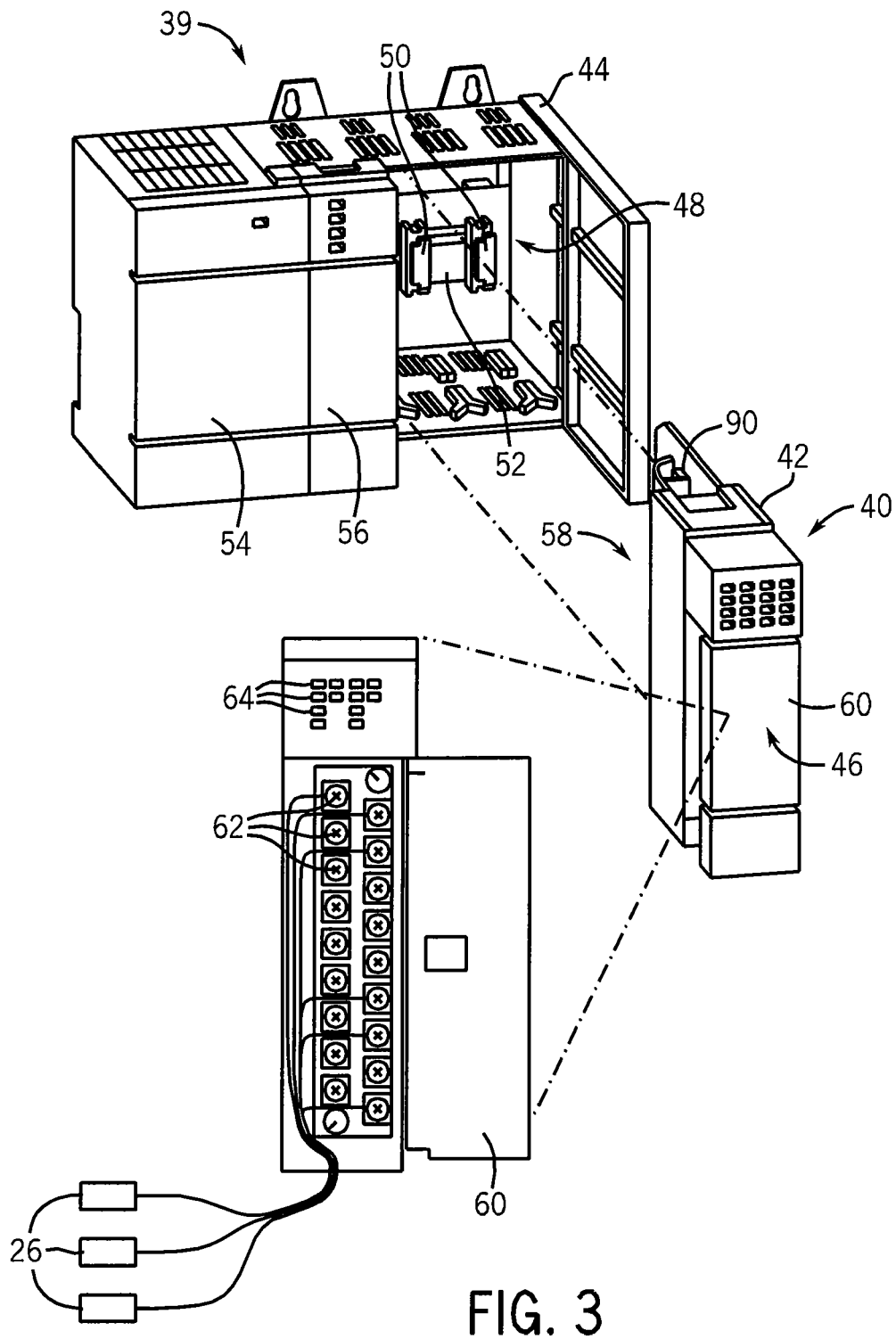
FIG. 3 is a perspective exploded view of an industrial controller having interchangeable I/O modules.

Referring now to FIG. 3, the present invention provides an I/O module 40 for an industrial controller 39. The I/O module 40 is depicted in a first embodiment implementing "chassis I/O" where the I/O module 40 has a housing 42 that may be slidably received within a chassis 44 along with other I/O modules (not shown) and other modules including a power supply 54 and a programmable logic controller 56.

Alternatively, the I/O module may also be implemented as "distributed I/O" and the differences in this implementation will be described below.

In the chassis I/O implementation, the chassis 44 may have a backplane 48 providing a set of releasable electrical connectors 50 interconnected by a backplane bus 52 extending along a rear wall of the chassis 44. A corresponding connector 58 on the rear of the housing 42 of the module 40 mates with the corresponding connectors 50 when the module 40 is placed within the chassis 44 providing electrical connection, for example, between the programmable logic controller 56 and the circuitry of the module 40. The bus 52 is typically a high-speed serial bus providing efficient multi-bit communication. The other modules of the power supply 54 and programmable logic controller 56 may have similar connectors 50 and 58 for this purpose.

The I/O module 40 may provide access to electrical switch 90 through an opening in the housing 42 when the I/O module 40 is not fully received within the chassis 44. When the I/O module 40 is fully received within the chassis 44, only a front faceplate 46 of the module 40 is exposed, and the remaining portions of the housing 42 as well as the switch 90 are enclosed within the chassis 44. In a distributed I/O implementation, the switch may remain accessible through an opening in the housing.

The front faceplate 46 of the I/O module 40 may open by means of a swinging door 60 to reveal a set of screw terminals 62 to which wires may be connected to connect internal I/O circuits of the I/O module 40 to various actuators 26. Indicator lights 64 corresponding to each of the different output circuits and hence to particular output terminal 62 are positioned to be visible through a bezel on the front faceplate 46.

In a distributed I/O implementation, multiple connectors 58 may provide for an Ethernet connection, an auxiliary power supply connection, input connection, and expansion board connection and the like. The housing 42 may provide for mountings to a DIN rail or the like.

Figure 4:
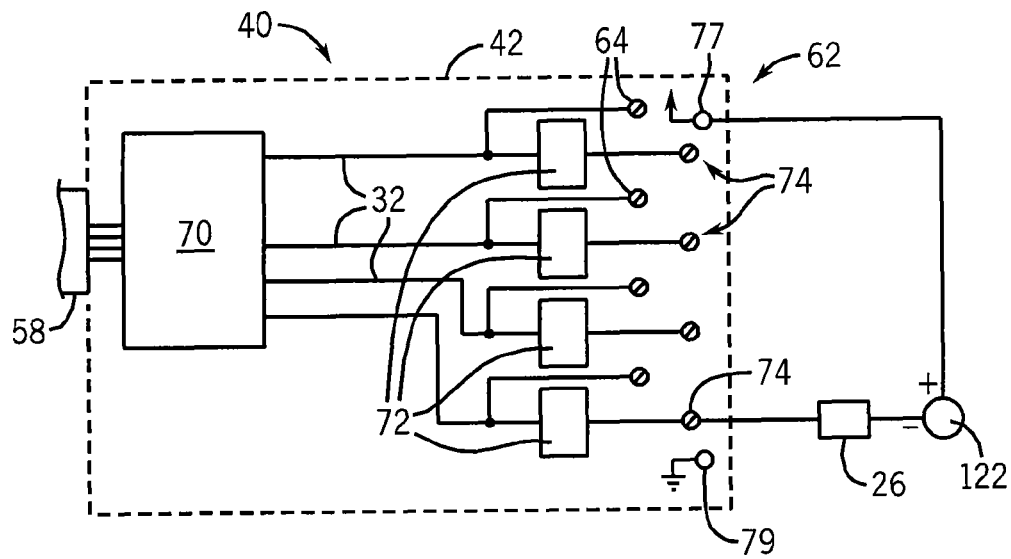
FIG. 4 is a block diagram of a simplified single I/O module of FIG. 3 providing multiple DC universal outputs circuits per the present invention.

Referring now to FIG. 4, the connector 58 on the rear of the housing 42 of the I/O module 40 may connect to a decoder circuit 70 which receives digital control signals encoded in serial fashion from the programmable logic controller 56 to provide a set of separate digital control signals 32 each having a logically true or logically false state. Typically, and in this described embodiment, the logically true state is a positive voltage and the logically false is a nominally zero voltage.

The lights 64 are connected to the digital signals 32 by appropriate amplification circuitry to provide a visual indication to the user of the industrial controller 39 of the state of the particular signal 32. In addition, the digital signals 32 are each provided to an output circuit 72 providing a universal (i.e. sinking or sourcing) output signal through given terminals 62. In a preferred embodiment, each output circuit 72 provides an output terminal 74 to which an actuator 26 may be attached. To reduce terminal numbers, a single external power terminal 77 for receiving a positive voltage from an externally supplied voltage source 22 and a single external ground terminal 79 for receiving a ground voltage from the externally supplied voltage source 22 are shared among the output terminal 74.

As depicted, a single load 26 may be configured in sinking mode connected to a power supply 122 having its positive terminal connected to power terminal 77. Alternatively, not depicted, the single load 26 may be configured in a sourcing mode connected to power supply 122 having its negative terminal connected to ground terminal 79.

While only four output circuits 72 are shown, a typical I/O module may provide 10 channel output and thus have ten outputs circuits 72 and employ only 12 total terminals.

Figure 5:
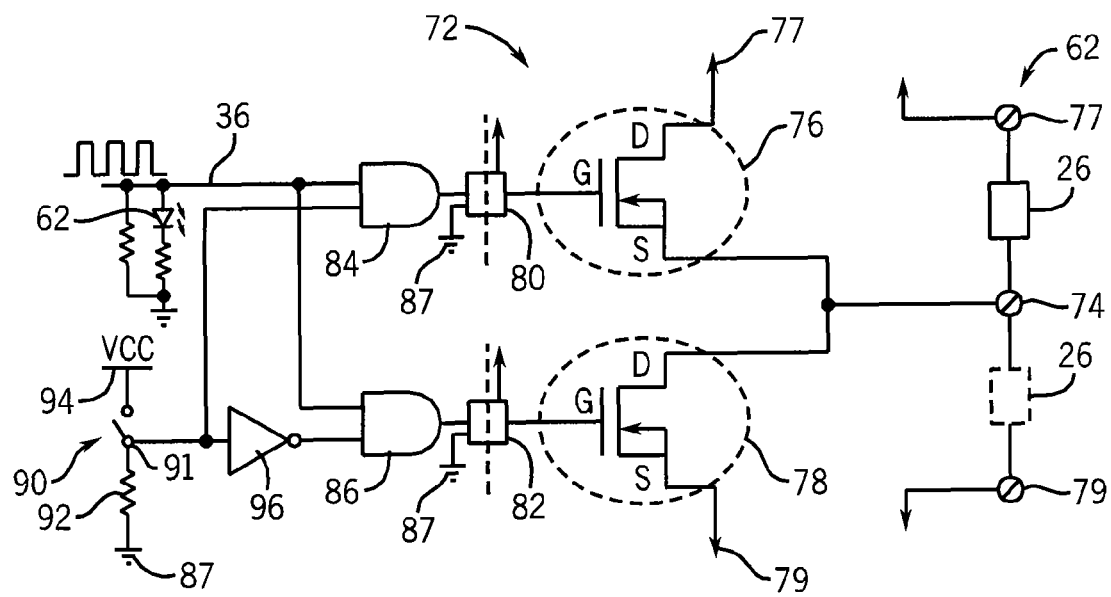
FIG. 5 is a schematic diagram of a single universal output circuit of FIG. 4 per the present invention.

Referring now to FIG. 5, output terminal 74 is connected to a junction between the source of a first n-channel MOSFET 76 and the drain of a second n-channel MOSFET 78. The drain of the first MOSFET 76 may be attached to the positive voltage obtained from terminal 77 while the source of MOSFET 78 may be attached to a ground obtained from terminal 79.

The gate of MOSFET 76 is attached to an output of optical isolator 80 providing internally a phototransistor (not shown) sourcing power from terminal 77 so as to provide a voltage compatible with particular connection as will be described. Similarly the gate of MOSFET 78 is connected to the output of an optical isolator 82 also receiving power from terminal 77 to source this power to the gate of MOSFET 78 under the control of an internal phototransistor.

The inputs of optical isolator 80 and 82 are attached to cathodes of light emitting diodes (not shown) to receive the outputs of the AND gates 84 and 86 respectively. The anode of the light emitting diodes is connected to nonisolated ground 87.

One input of each AND gate 84 and 86 is attached to the digital signal 36 associated with a particular output circuit 72 and driving light 64. The remaining input of AND gate 84 connects to one terminal 91 of a mechanical switch 90. This terminal 91 is also connected to a resistance 92 to ground 87. The other terminal of the switch connects to a nonisolated power source 94 so that the power source 94 is switchably connected to terminal 91.

It will be understood that damage to the switch 90 such as prevents good electrical flow (including possible contact corrosion) will therefore result in terminal 91 being pulled to ground through resistance 92.

Terminal 91 connects through an inverter 96 to the remaining input of AND gate 86.

The position of the switch 90 provides a direction signal at terminal 91. When this direction signal is high, the output circuit 72 operates in a sourcing mode and when this direction signal is low, the output circuit 72 operates in a sinking mode as will be described. Specifically, when the switch 90 is closed, the output of AND gate 86 will always be low causing MOSFET 78 to be turned off (nonconducting) while the output of AND gate 84 will follow digital signal 36 causing MOSFET 76 to turn on when digital signal 36 is in a true state (high) and off when digital signal 36 is in a false state (low). This will provide a sourcing of current out of terminal 74 to actuator 26 connected between terminals 74 and 79.

Conversely when switch 90 is opened, terminal 91 will be low causing the output of inverter 96 to go high and of the output of AND gate 86 to follow the digital signal 36 turning MOSFET 78 on when digital signal 36 is in a true state and off when digital signal 36 is in the false state. In this mode, AND gate 84 will always have a low output turning MOSFET 76 off (nonconducting). Accordingly, in this state, current is sinked into terminal 74 when digital signal 36 is in a high state to provide a sinking of current through actuator 26 connected between terminals 77 and 74.

In this way, a single terminal 74 may source or sink current from actuators 26 or other loads without the need for a mechanical switch controlling high current flow. In an alternative embodiment, the signal at terminal 91 may be provided from the decoder circuit 70 permitting software selection (for example, using the control program on the programmable logic controller 56) of the state of each output terminal 74.

It will be further understood that failure of switch 90 will cause terminal 91 to go to a low state, putting output circuit 72 into the sinking mode which will generally be a safer mode when the particular wiring of the actuator 26 between terminals 77 and 74 or 74 and 79 is unknown. In one embodiment, the signal at terminal 91 produced by the switch 90 may generated by the industrial controller so that the configuration of the I/O module terminals as sinking or sourcing mode may be controlled through software.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from liberal language of the claims. Generally, as will be recognized by those of ordinary skill in the art, the features of the present invention may be implemented in different combinations of hardware and software executing on an electronic computer including just one or the other.

We claim:

1. An I/O module for an industrial controller providing digital control signals for controlling application of electrical power to actuators on a controlled machine during a true state of the digital control signals, the I/O module comprising:
   an electrical connector for releasably attaching the I/O module to the industrial controller for communication of the digital control signals therebetween; and
   for a given digital control signal,
   (1) a releasable terminal providing a connection to the actuator for a provision of electrical power to the actuator in accordance with the state of the given digital control signal;
   (2) a first transistor device connected between the releasable terminal and a terminal receiving a first DC voltage to provide a current flow from the first DC voltage to the releasable terminal when the first transistor device is turned on;
   (3) a second transistor device connected between the releasable terminal and a terminal receiving a second DC voltage to provide a current flow from the releasable terminal to the second DC voltage source when the second transistor is turned on;
   (4) a logic circuit providing transistor control signals to the first and second transistor and receiving the given digital control signal and a direction signal indicating whether the releasable terminal should operate as a sourcing DC output or a sinking DC input and
   (a) when the direction signal indicates that the releasable terminal should operate as a sourcing DC output, providing:
      (i) a transistor control signal to the first transistor turning the first transistor on only when the given digital control signal is true and otherwise turning the first transistor off;
      (ii) a transistor control signal to the second transistor turning the second transistor off both when the given digital control signal is true and otherwise; and
   (b) when the direction signal indicates that the releasable terminal should operate as a sinking DC output, providing:
      (i) a transistor control signal to the second transistor turning the second transistor on only when the given digital control signal is true and otherwise turning the second transistor off,
      (ii) a transistor control signal to the first transistor turning the first transistor off both when the given digital control signal is true and otherwise.

2. The I/O module of claim 1 wherein the first and second transistors are both n-channel MOSFET transistors.

3. The I/O module of claim 1 wherein further including an electrical switch manually operable to provide the direction signal.

4. The I/O module of claim 3 wherein the I/O module includes a housing fitting within a chassis to engage mating of electrical connectors communicating the digital control signals to the I/O module, and wherein the exposed face of the housing holds the releasable terminals and wherein the electrical switch is positioned to be covered by the chassis when the housing is fit within the chassis.

5. The I/O module of claim 3 wherein the electrical switch provides a switchable connection to a first electrical voltage and a resistive connection to a second electrical voltage so that when the switchable connection is open the direction signal indicates that the releasable terminal should operate as a sinking DC output.

6. The I/O module of claim 1 further including a releasable terminal receiving the first DC voltage.

7. The I/O module of claim 6 wherein further including a first and second optical isolator receiving at an isolated input the transistor control signals for the first and second transistors and receiving at an isolated output the first DC voltage for generation of the isolated transistor control signals.

8. The I/O module of claim 1 wherein for the digital control signal further including a third releasable terminal receiving the second DC voltage.

9. The I/O module of claim 1 further including an illuminated indicator associated with the releasable terminal illuminating when the digital control signal is logically true to provide a visual indication of when the digital control signal is logically true.

10. The I/O module of claim 1 further including a serial communication circuit exchanging serial data with the industrial controller to provide the digital control signals.

11. The I/O module of claim 1 wherein further including an industrial controller executing a stored program to read signals from input I/O modules connected to the controlled equipment to provide the state of the digital control signals.

12. A method of operating an I/O module for an industrial controller providing digital control signals for controlling application of electrical power to actuators on a controlled machine during a true state of the digital control signals, the I/O module being of a type comprising:
   an electrical connector for releasably attaching the I/O module to the industrial controller for communication of the digital control signals therebetween; and having for a given digital control signal:
   (1) a releasable terminal providing a connection to the actuator for a provision of electrical power to the actuator in accordance with the state of the given digital control signal;
   (2) a first transistor device connected between the releasable terminal and a terminal receiving a first DC voltage to provide a current flow from the first DC voltage to the releasable terminal when the first transistor device is turned on;
   (3) a second transistor device connected between the releasable terminal and a terminal receiving a second DC voltage to provide a current flow from the releasable terminal to the second DC voltage source when the second transistor is turned on;
   (4) a logic circuit providing transistor control signals to the first and second transistor and receiving the given digital control signal and a direction signal indicating whether the releasable terminal should operate as a sourcing DC output or a sinking DC input; the method including the steps of:
   (a) when the direction signal indicates that the releasable terminal should operate as a sourcing DC output, providing:
      (i) a transistor control signal to the first transistor turning the first transistor on only when the given digital control signal is true and otherwise turning the first transistor off, (ii) a transistor control signal to the second transistor turning the second transistor off both when the given digital control signal is true and otherwise; and (b) when the direction signal indicates that the releasable terminal should operate as a sinking DC output, providing:

(i) a transistor control signal to the second transistor turning the second transistor on only when the given digital control signal is true and otherwise turning the second transistor off, (ii) a transistor control signal to the first transistor turning the first transistor off both when the given digital control signal is true and otherwise.

13. The method of claim 12 wherein the first and second transistors are both n-channel MOSFET transistors.

14. The method of claim 12 wherein further wherein the direction signal is provided by a manually operable switch.

15. The I/O module of claim 14 wherein the electrical switch provides a switchable connection to a first electrical voltage and a resistive connection to a second electrical voltage so that when the switchable connection is open the direction signal indicates that the releasable terminal should operate as a sinking DC output.

16. The I/O module of claim 12 wherein further including a first and second optical isolator receiving at an isolated input the transistor control signals for the first and second transistors and including the step of receiving at an isolated output a first DC voltage for generation of the isolated transistor control signals.

17. The method of claim 12 further including an illuminated indicator associated with the releasable terminal and including the step of illuminating the illuminated indicator when the digital control signal is logically true to provide a visual indication of when the digital control signal is logically true.

18. The method of claim 12 further including the step of communicating the digital control signals using a serial communication circuit exchanging serial data with the industrial controller.

19. The method of claim 12 wherein further including the step of providing the state of the digital control signals using an industrial controller executing a stored program to read signals from input I/O modules connected to the controlled equipment.

* * * * *